US007288344B2

(12) United States Patent
Frost et al.

(10) Patent No.: US 7,288,344 B2
(45) Date of Patent: Oct. 30, 2007

(54) ACCOMMODATING DIFFRACTION IN THE PRINTING OF FEATURES ON A SUBSTRATE

(75) Inventors: Rex K. Frost, Hillsboro, OR (US); Swaminathan (Sam) Sivakumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 569 days.

(21) Appl. No.: 10/698,782

(22) Filed: Oct. 31, 2003

(65) Prior Publication Data

US 2005/0097502 A1    May 5, 2005

(51) Int. Cl.
*G03F 1/00* (2006.01)
*G03C 5/00* (2006.01)

(52) U.S. Cl. .............................. 430/5; 430/30; 430/394
(58) Field of Classification Search .................... 430/5, 430/30, 394; 716/19–21
See application file for complete search history.

(56) References Cited

U.S. PATENT DOCUMENTS

| | | | |
|---|---|---|---|
| 5,821,014 A * | 10/1998 | Chen et al. ................... | 430/5 |
| 6,200,710 B1 * | 3/2001 | Hada ............................ | 430/5 |
| 6,492,069 B1 | 12/2002 | Wu et al. | |
| 6,500,587 B1 | 12/2002 | Ghandehari et al. | |
| 6,524,752 B1 | 2/2003 | Pierrat | |
| 6,524,755 B2 | 2/2003 | Jin et al. | |
| 6,569,580 B2 | 5/2003 | Campi et al. | |
| 6,792,591 B2 * | 9/2004 | Shi et al. ....................... | 716/19 |
| 6,964,032 B2 * | 11/2005 | Liebmann et al. ............ | 716/19 |

OTHER PUBLICATIONS

Liebmann, L., "Layout Impact of Resolution Enhancement Techniques: Impediment or Opportunity", *International Symposium on Physical Design 2003*, Session 7, pp. 110-117, Monterey, CA, Apr. 6-9, 2003.

Liebmann, L., "Resolution Enhancement Techniques in Optical Lithography, It's not just a Mask Problem", *Proceedings SPIE, Photomask and Next-Generation Lithography Mask Technology VIII*, vol. 4409, pp. 23-32 (2001).

Nordquist, K., et al., "Critical Dimension and Image Placement Issues for Step and Flash Imprint Lithography Templates", *Proceedings of SPIE, 22nd Annual BACUS Symposium on Photomask Technology*, vol. 4889, No. 129, pp. 1143-1150 (2002).

Petersen, J., et al., "Development of a Sub-100nm Integrated Imaging System Using Chromeless Phase-Shifting Imaging with Very High NA KrF Exposure and Off-axis Illumination", *Proceedings SPIE, Design, Process Integration, and Characterization for Microelectronics*, vol. 4692, pp. 298-311 (2002).

Scheid, G., et al., "Contact Holes: Optical Area Measurement Predicts Printability and is Highly Repeatable", presented at Photomask Japan 2001, Paper 4409-11, pp. 1-6 (2001).

Zhang, H., et al., "Compact Formulation of Mask Error Factor for Critical Dimension Control in Optical Lithography", *Proceedings SPIE, Metrology, Inspection, and Process Control for Microlithography XVI*, vol. 4689, pp. 462-465 (2002).

* cited by examiner

*Primary Examiner*—S. Rosasco
(74) *Attorney, Agent, or Firm*—Fish & Richardson P.C.

(57) ABSTRACT

Systems and techniques for accommodating diffraction in the printing of features on a substrate. In one implementation, a method includes identifying a pair of features to be printed using a corresponding pair of patterning elements and increasing a separation distance between the pair of patterning elements while maintaining the sufficiently small pitch between the corresponding imaged features. The pitch of the pair of features can be sufficiently small that, upon printing, diffraction will make a separation between the features smaller than a separation between the corresponding pair of patterning elements.

29 Claims, 5 Drawing Sheets

ACCOMMODATING DIFFRACTION IN THE PRINTING OF FEATURES ON A SUBSTRATE

BACKGROUND

Various techniques may be used to print features such as patterns that define integrated circuits on semiconductor wafers. In general, electromagnetic wave emissions from a source are directed to expose selected locations on a substrate while leaving other locations unexposed. Example emissions include visible light, ultraviolet (UV) and extreme ultraviolet (EUV) radiation, and X-rays. Example approaches to directing these emissions toward selected locations include selective attenuation (e.g., using binary photomasks), interference (e.g., using phase shifting masks), reflection (e.g., using EUV reflective optical elements), and beam steering.

Regardless of the approach used to direct such emissions, diffraction orders that scale with the wavelength of the emission may blur the boundary between directly exposed locations to which the emission is directed and other locations to which the emission is not directed. Such blurring makes the printing of features with dimensions in the vicinity of the wavelength more difficult. For example, when features are proximal, the features may not resolve due to diffractive exposure of the intervening space.

When adjacent contacts in a contact pair are not resolved, they tend to behave as a single contact. For example, forming a contact with a first contact of an unresolved pair generally results in inadvertent shorting with the second contact.

DESCRIPTION OF DRAWINGS

Like reference symbols in the various drawings indicate like elements.

DETAILED DESCRIPTION

Lithographic techniques may be used to define features in integrated circuits. As the size of the features decreases to a size approximating the wavelength of the radiation used to define the features, distortions due to diffraction may become a factor.

Figure 1:
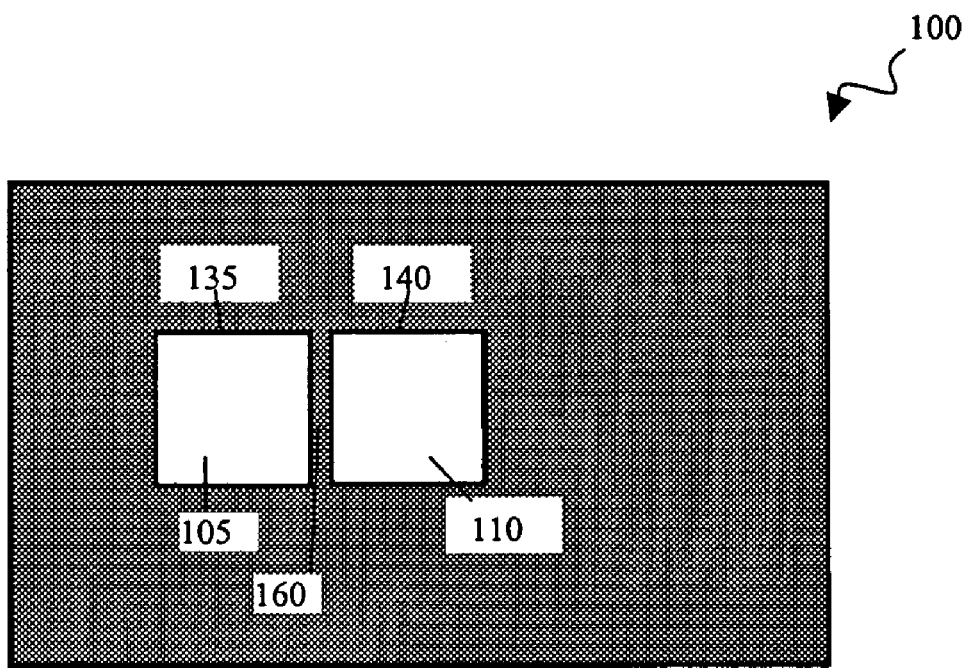
FIG. 1 is a top diagrammatic view of a photomask.
Figure 2:
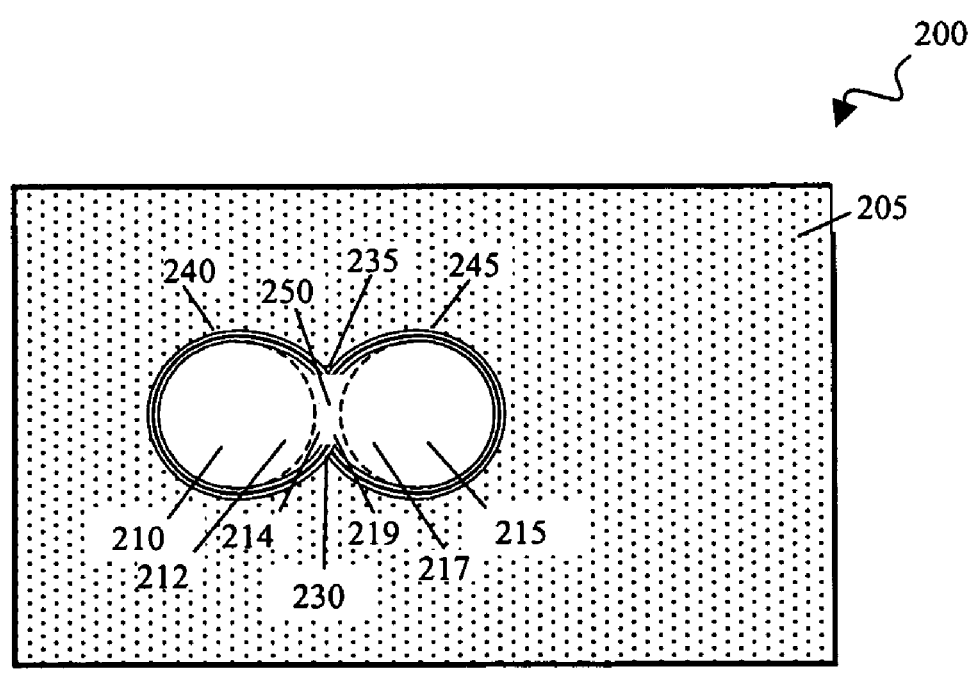
FIG. 2 is a top diagrammatic view of a pattern printed with the photomask of FIG. 1.
Figure 3:
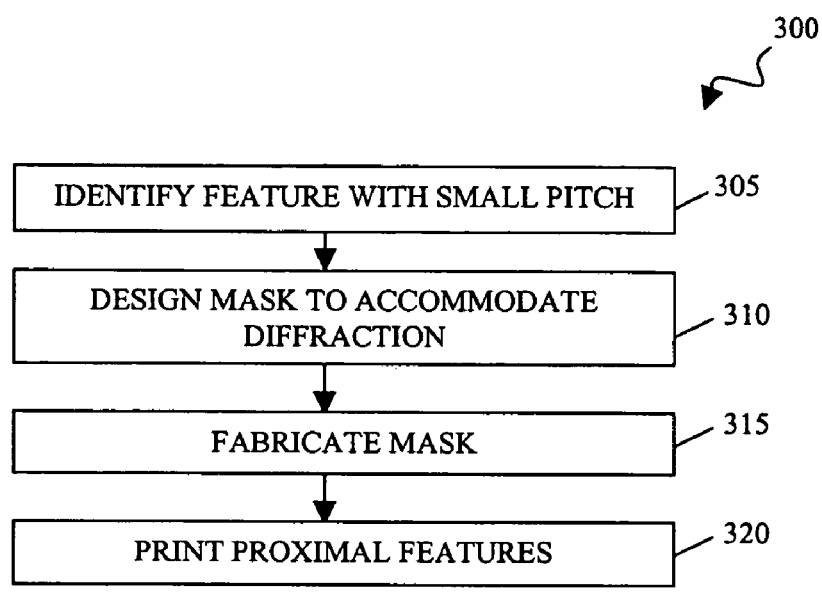
FIG. 3 is a flowchart of a process for printing features on a substrate.

FIGS. 1-3 illustrate consequences of diffraction upon features with dimensions in the vicinity of the wavelength of the printing electromagnetic radiation. FIG. 1 shows a photomask 100 that includes a pair of apertures 105, 110. Photomask 100 is a dark field binary photomask. Apertures 105, 110 are light transmitting regions of photomask 100 that may act as patterning elements for photoresists. Apertures 105, 110 are defined by edges 135, 140 and are separated by a smallest separation 160.

FIG. 2 shows a pattern 200 formed in a positive resist 205 using mask 100 (FIG. 1). Pattern 200 includes a first printed feature 210 and a second printed feature 215 defined in resist 205. Printed features 210, 215 are generally rounded, whereas apertures 105, 110 of mask 100 (FIG. 1) include generally sharp corners. As discussed, the printing of features with dimensions in the vicinity of the emission wavelength is complicated by diffraction. In mask 100, the corners of apertures 105, 110 are such features. As a consequence of diffraction, the corners become blurred into rounded edges during printing.

Feature 210 is bounded by a sidewall 240 and feature 215 is bounded by sidewall 245. Sidewalls 240, 245 are poorly defined relative to edges 135, 140 of mask 100 (FIG. 1) due to diffraction during printing. This poor definition is illustrated by the triple line of sidewalls 240, 245 in FIG. 2, showing that the boundaries between exposed and unexposed locations in resist 205 are not abrupt but rather broader than the edges 135, 140 of mask 100.

Feature 210 includes a first portion 212 and a second portion 214. Feature 215 includes a first portion 217 and a second portion 219. First portions 212, 217 are printed by direct exposure of light passing through apertures 105, 110 of mask 100. Second portions 214, 219 are printed by wave diffraction of light passing through apertures 105, 110 of mask 100. As a consequence of diffracted light printing second portions 214, 217, sidewalls 240, 245 intersect at intersections 230, 235 to join features 210, 215 at a neck 250. Features 210, 215 are therefore not resolved in pattern 200.

FIG. 3 shows a process 300 which accommodates for diffraction, and the associated distortion of printed features, according to one implementation. Process 300 may be performed by one or more actors (such as a device manufacturer, a mask manufacturer, or a foundry), acting alone or in concert. Process 300 may also be performed in whole or in part by a data processing device executing a set of machine-readable instructions. For example, masks may be designed to accommodate diffraction using optical proximity correction (OPC) software.

The actor performing process 300 identifies features with a small feature pitch in a desired pattern at 305. The pitch of features is the smallest spatial periodicity of the features. Features with a small pitch may be identified by comparing the desired pitch of the features with the wavelength of the emission used to print the features and characteristics of the equipment and techniques used to print the features. Such features may be identified from a machine-readable description of a desired feature layout or the features may be identified by empirical studies (such as scanning electron microscopy (SEM) imaging) of printed features.

Once such features are identified, a mask designed to accommodate diffraction may be laid out at 310. Diffraction may be accommodated by distorting the designed apertures in the vicinity of the smallest feature pitch. In an implementation, apertures may be expanded in dimensions perpendicular to the pitch so that the total area of the aperture is generally maintained while the separation distance between proximal features is increased. In another implementation, mask apertures may be bowed in the vicinity of the smallest feature pitch to increase the separation distance between features upon printing.

In another implementation, diffraction may also be accommodated to print symmetrical features. In particular, a mask or other approach for directing emissions may be designed to expose locations that are larger in the dimension perpendicular to the pitch of the features than in the dimension parallel to the pitch of the features. As a result of diffractive exposure of the smallest separation between proximal features, symmetrical features may be obtained. The details of such approaches is described further below. The diffraction-accommodating mask is then fabricated at 315 and used to print features for a device at 320.

Figure 4:
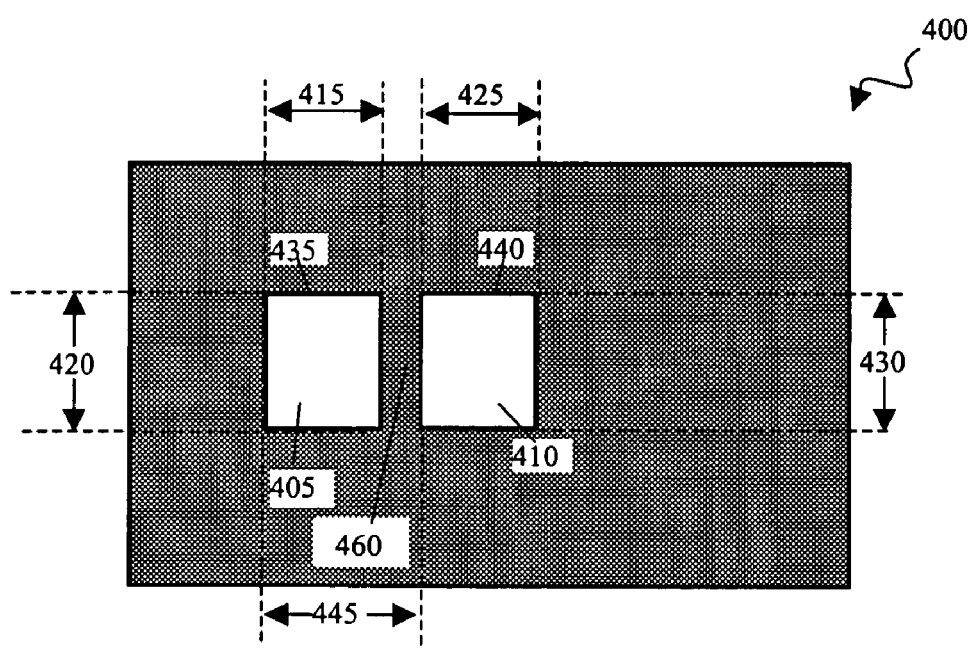
FIG. 4 is a top diagrammatic view of a photomask.

FIG. 4 shows a top view of a photomask 400 that is designed to accommodate diffraction. Photomask 400 may be a binary photomask or photomask 400 may be a phase shift mask (PSM). For example, photomask 400 may be a dark field binary photomask or a rim or attenuated PSM.

Photomask 400 includes a pair of apertures 405, 410. Apertures 405, 410 are light transmitting regions of photomask 400. Aperture 405 has a first dimension 415 and a second dimension 420. Aperture 410 has a first dimension 425 and a second dimension 430. Dimensions 415, 420, 425, 430 may be selected to maintain an effective flux through apertures 405,. 410 for printing.

Aperture 405 is bounded by an edge 435 and aperture 410 is bounded by an edge 440. Apertures 405, 410 have a pitch 445. Pitch is the smallest spatial periodicity of the features. For example, in mask 400, pitch 445 is the sum of the width of aperture 405 and a smallest separation 460 between apertures 405, 410 in the direction parallel to a line joining centers 450, 455.

First dimensions 415, 425 may be defined parallel with pitch 445, as illustrated. Apertures 405, 410 are closest to one another at a smallest separation 460.

Figure 5:
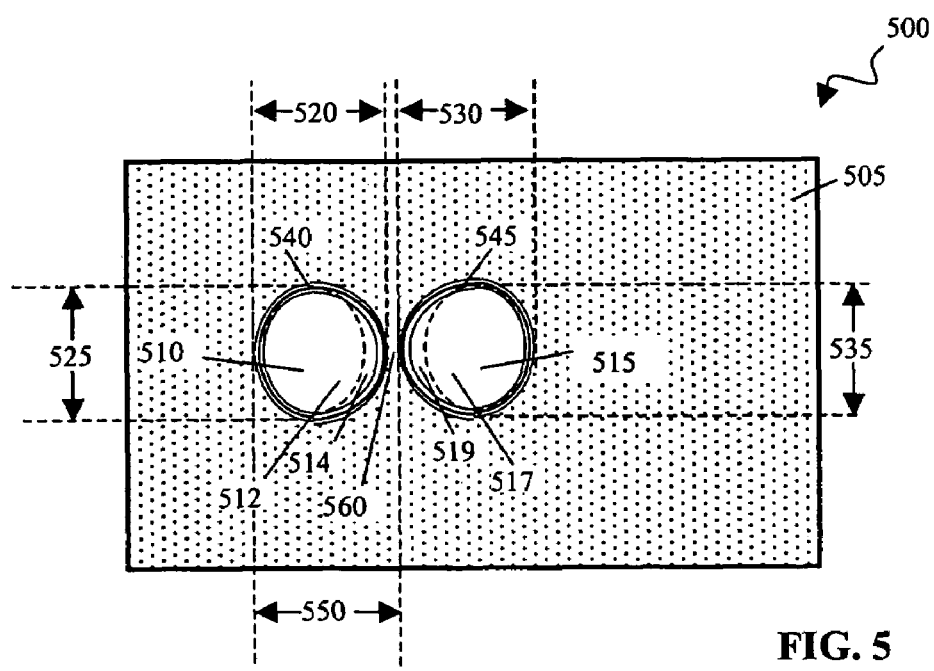
FIG. 5 is a top diagrammatic view of a pattern printed with the photomask of FIG. 4.

FIG. 5 shows a pattern 500 formed in a positive resist 505 using mask 400 (FIG. 4). Pattern 500 may be used to form a portion of an integrated circuit on a semiconductor wafer such as a contact pair in a SRAM. For example, an underlying semiconducting or interlayer dielectric material may be selectively etched using pattern 500.

Pattern 500 includes a first feature 510 and a second feature 515 defined in resist 505. Feature 510 has a first dimension 520 and a second dimension 525. Feature 515 has a first dimension 530 and a second dimension 535. Features 510, 515 have a pitch 550 and are separated by a smallest separation 560 that isolates feature 510 from feature 515.

Feature 510 is bounded by a sidewall 540 and feature 515 is bounded by sidewall 545. Sidewalls 540, 545 are poorly defined relative to edges 535, 540 of mask 500 (FIG. 5) due to diffraction during printing. This poor definition is illustrated by the triple line of sidewalls 540, 545 in FIG. 5, showing that the boundaries between exposed and unexposed locations in resist 505 are not abrupt but rather relatively broad.

Feature 510 includes a first portion 512 and a second portion 514. Feature 515 includes a first portion 517 and a second portion 519. First portions 512, 517 are printed by direct exposure by electromagnetic radiation passing through apertures 505, 510 of mask 500. Second portions 514, 519 are printed by wave diffraction of the electromagnetic radiation passing through apertures 505, 510 of mask 500.

As a consequence of diffractive exposure of second portions 514, 519, features 510, 515 are distorted relative to apertures 505, 510 of mask 400 (FIG. 4). In particular, the ratio of first dimension 520 to second dimension 525 in pattern 500 is larger than the ratio of first dimension 415 to second dimension 420 in mask 400. Also, the ratio of first dimension 530 to second dimension 535 in pattern 500 is larger than the ratio of first dimension 420 to second dimension 425 in mask 400. Features 510, 515 have thus been expanded in the dimension parallel to pitch 545 to make separation 560 relatively smaller than separation 460.

Such distortion has been accommodated by mask 400 which includes selectively reduced feature sizes parallel to pitch 445. In particular, the selective reduction of first dimensions 415, 425 relative to second dimensions 420, 430 in mask 400 (FIG. 4) prevents features 510, 515 from intersecting and allows a relatively small footprint of features 510, 515 in pattern 500 since the distortion due to diffraction is anticipated.

Moreover, dimensions 415, 425, 420, 430 in mask 400 may be selected to achieve particular feature geometries when printing. As shown in FIG. 4, dimensions 415, 425, 420, 430 may be selected so that first dimension 520 is substantially equal to second dimension 525 and so that first dimension 530 is substantially equal to second dimension 535. Dimensions 415, 425, 420, 430 may also be selected so print generally tubular features 510, 515 with an axis of symmetry generally perpendicular to the plane of the substrate.

Figure 6A:
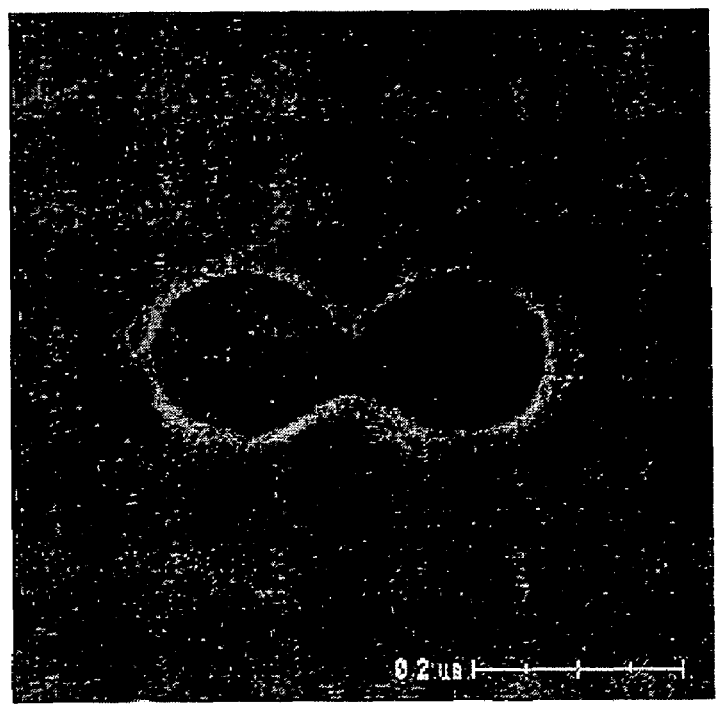
FIGS. 6A, 6B, and 6C are critical dimension scanning electron microscopy (CD-SEM) images illustrating mask feature modifications that enable the resolution of features near the diffraction limit.
Figure 6B:
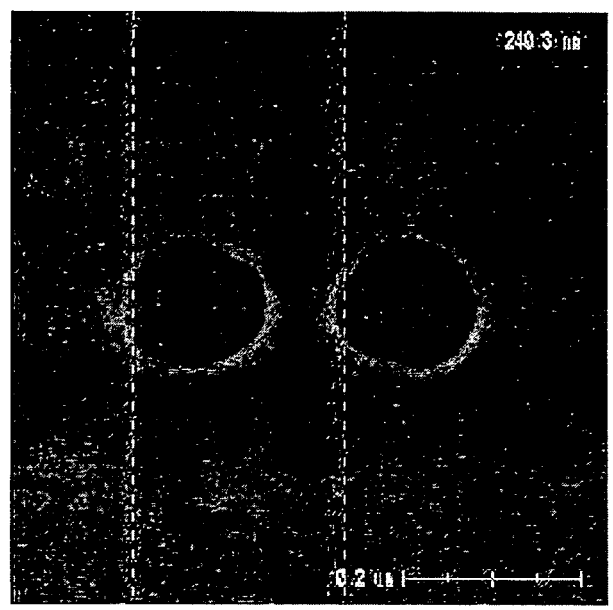
Figure 6C:
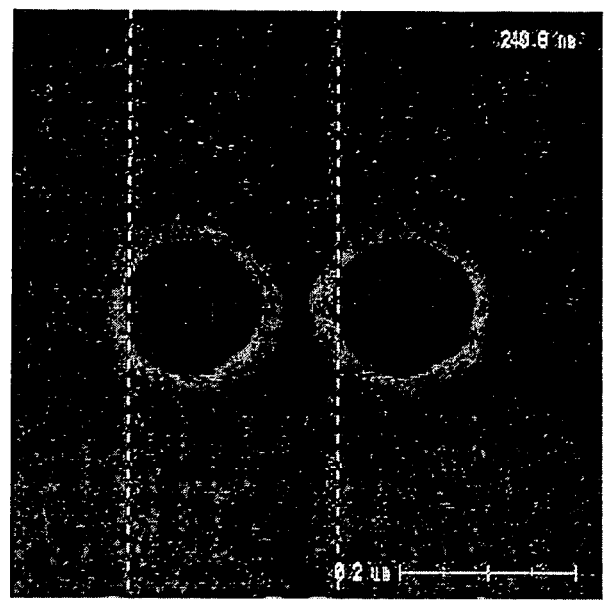

FIG. 6A-6C illustrate mask feature modifications that enable the resolution of features near the diffraction limit.

FIG. 6A is a CD-SEM image at 200K magnification of a contact pair printed in photoresist. The contact pair is the primary feature used in current SRAM designs. The target pitch in this case is 240 nm. The lithography process fails to resolve the mask features and the contacts overlap. Electrical isolation is therefore not achieved and the device is not functional. The nominal 1X mask feature dimensions are 180 nm X CD (critical dimension)/180 nm Y CD (both contacts)/240 nm pitch.

FIG. 6B is another contact pair printed in photoresist. The lithography process is identical to that used in FIG. 6A except the 1X mask pitch of the contact pair is increased to 260 nm. The 240 nm target pitch is successfully printed in photoresist and the device is functional although the contact X-CD is 13 nm larger than the Y-CD.

FIG. 6C is yet another contact pair printed in photoresist. In this case, the lithography process is identical to that used above except the 1X mask features are adjusted to 170 nm X CD/190 nm Y CD (both contacts)/260 nm pitch. The 240 nm target pitch is achieved, no X-Y contact dimension bias is present, and the device is functional. Furthermore, removing X-Y bias improves the process defocus margin.

Figure 7:
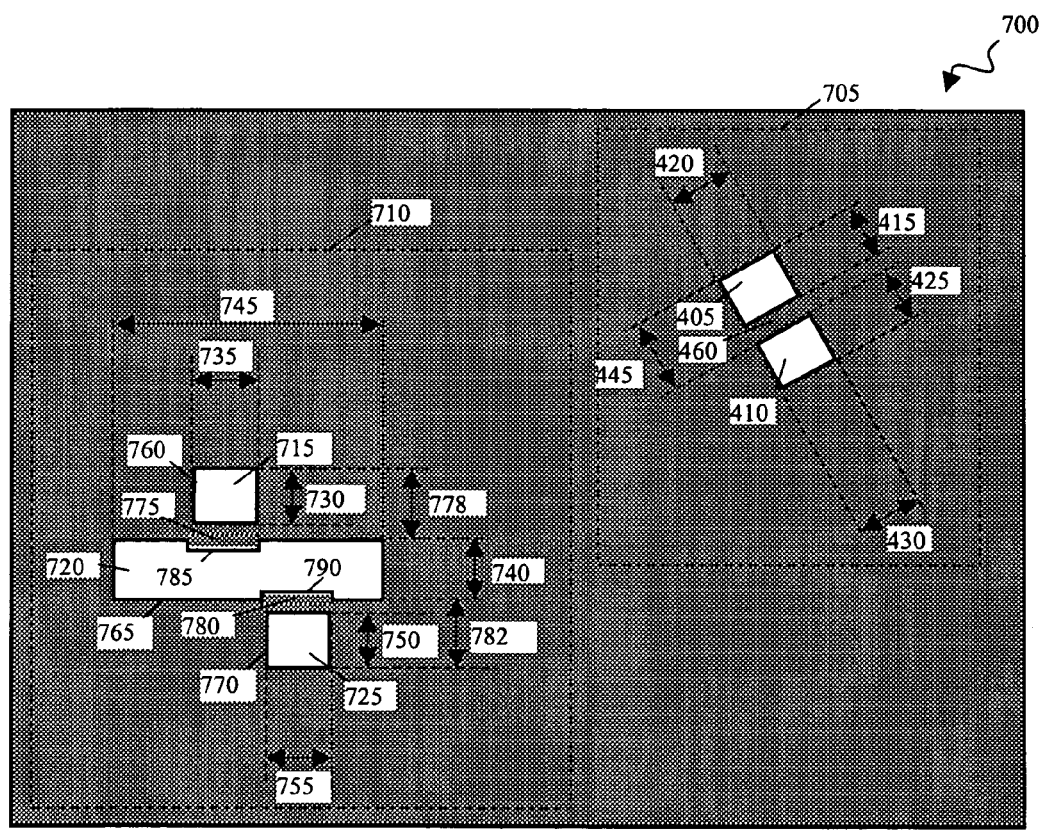
FIG. 7 is a top diagrammatic view of a photomask.

Diffraction effects may also be compensated for by bowing patterning elements in the mask. FIG. 7 illustrates a mask with such bowed features. FIG. 7 shows a photomask 700 that includes two sets of apertures 705, 710. Photomask 700 may be a binary photomask or a phase shift mask. Aperture sets 705, 710 include the light transmitting regions of photomask 700.

First aperture set 705 includes apertures 405, 410 that have pitch 445. As in mask 400 (FIG. 4), aperture 405 has a first dimension 415 and a second dimension 420, while aperture 410 has a first dimension 425 and a second dimension 430. First dimensions 415, 425 are defined parallel with pitch 445 and independently of the orientation of apertures 405, 410 upon photomask 700. Apertures 405, 410 are separated by a smallest separation 460.

Second aperture set 710 includes apertures 715, 720, 725. Aperture 715 has a first dimension 730 and a second dimension 735, aperture 720 has a first dimension 740 and a second dimension 745, and aperture 725 has a first dimension 750 and a second dimension 755. Aperture 715 is bounded by an edge 760, aperture 720 is bounded by an edge 765, and aperture 720 is bounded by an edge 770.

Apertures 715, 720 are closest to one another at a smallest separation 775 with a pitch 778, and apertures 720, 725 are closest to one another at a smallest separation 780 with a pitch 782. In the vicinity of separations 775, 780, edge 765 is bowed away from apertures 715, 725 at 785, 790. This bowing of edge 765 locally decreases the ratio of first dimension 740 to second dimension 745 and increases separations 775, 780 without requiring a larger footprint.

Furthermore, apertures 715, 725 may be distorted so that the ratio of first dimension 735 to second dimension 730 (and first dimension 755 to second dimension 750) is larger than the desired ratio of the corresponding dimensions of the printed features.

Figure 8:
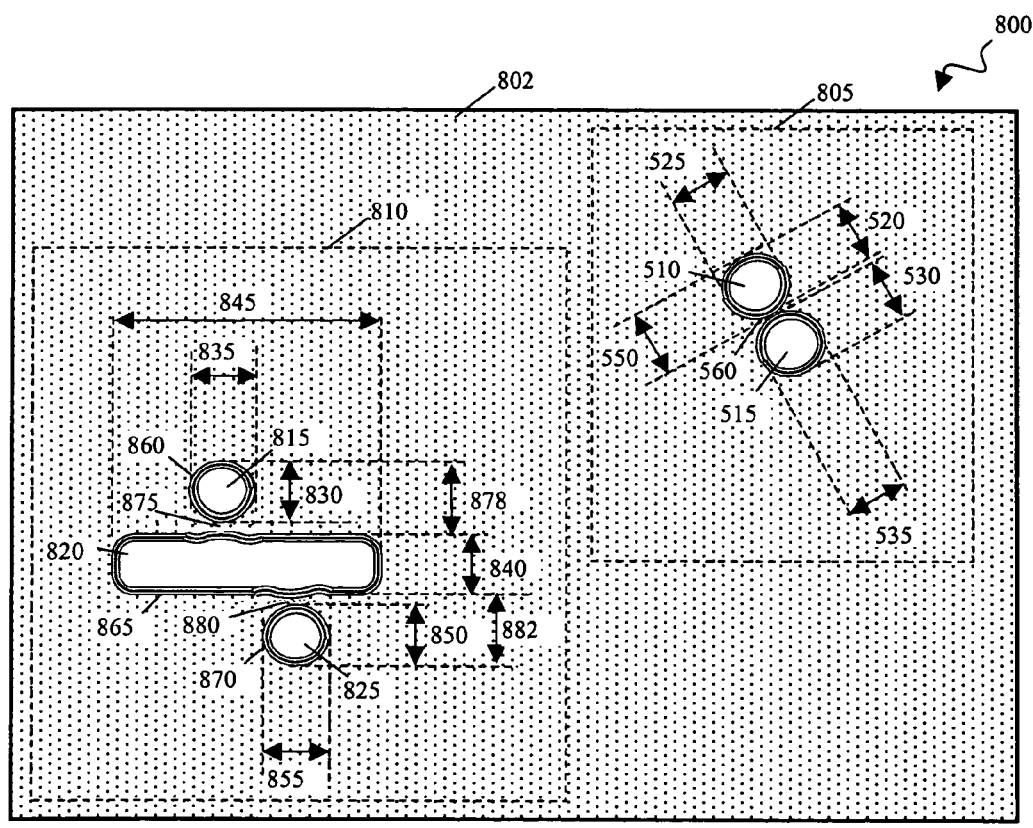
FIG. 8 is a top diagrammatic view of a pattern printed with the photomask of FIG. 7.

FIG. 8 shows a pattern 800 formed in a positive resist 802 using mask 700 (FIG. 7). Pattern 800 may be a portion of an integrated circuit on a semiconductor wafer. Pattern 800 includes two sets of features 805, 810. First feature set 805 includes first feature 510 and second feature 515. Feature 510 has first dimension 520 and second dimension 525. Feature 515 has first dimension 530 and second dimension 535. Features 510, 515 have a pitch 550 and are separated by a smallest separation 560 that isolates feature 510 from feature 515.

As a consequence of diffraction, features 510, 515 are distorted relative to apertures 405, 410 of mask 700 (FIG. 7). In particular, the ratio of first dimension 520 to second dimension 525 in pattern 800 is larger than the ratio of first dimension 515 to second dimension 520 in mask 700. Also, the ratio of first dimension 530 to second dimension 535 in pattern 800 is larger than the ratio of first dimension 420 to second dimension 425 in mask 700. Printing expands features 510, 515 in the dimension parallel to pitch 445 to make separation 560 relatively smaller than separation 460.

Second feature set 810 includes features 815, 820, 825. Feature 815 has a first dimension 830 and a second dimension 835, feature 820 has a first dimension 840 and a second dimension 845, and feature 825 has a first dimension 850 and a second dimension 855.

Feature 815 is bounded by a sidewall 860, feature 820 is bounded by a sidewall 865, and feature 820 is bounded by a sidewall 870. Sidewalls 860, 865, 870 are poorly defined relative to edges 760, 765, 770 of mask 700 (FIG. 7) due to diffraction during printing. This poor definition is illustrated by the triple line of sidewalls 860, 865, 870 in FIG. 8, showing that the boundaries between exposed and unexposed locations in resist 802 are not abrupt but rather relatively broad. Features 815, 820 are closest to one another at a smallest separation 875 with a pitch 878 and features 820, 825 are closest to one another at a smallest separation 880 with a pitch 782. Separations 875, 880 isolate features 815, 820, 825 from one another.

As a consequence of diffraction, features 815, 820, 825 are distorted relative to apertures 715, 720, 725 of mask 700 (FIG. 7). For example, in the vicinity of separations 875, 880, sidewall 865 of pattern 800 (FIG. 8) does not bow as far away from features 815, 825 as edge 765 bows away from apertures 715, 725 in mask 700 (FIG. 7). Instead, sidewall 865 has been expanded toward features 815, 825 to make separations 875, 880 relatively smaller than separations 775, 780.

This expansion of sidewall 865 in the vicinity of separation 875 locally increases the ratio of first dimension 840 to second dimension 845 in the vicinity of separation 875 in pattern 800 (FIG. 8) above the ratio of first dimension 740 to second dimension 745 in the vicinity of separation 775 in mask 700 (FIG. 7). Similarly, the expansion of sidewall 865 in the vicinity of separation 880 locally increases the ratio of first dimension 840 to second dimension 845 in the vicinity of separation 880 in pattern 800 (FIG. 8) above the ratio of first dimension 740 to second dimension 745 in the vicinity of separation 780 in mask 700 (FIG. 7).

In effect, the bowing of edge 765 in mask 700 helps accommodate the distortion of feature 820 in the vicinity of pitches 878, 882. The selective reduction of first dimension 740 relative to second dimension 745 in mask 700 (FIG. 7) helps prevent features 815, 820, 825 from intersecting and allows a relatively small footprint of features in pattern 800 since the distortion due to diffraction is anticipated.

As another consequence of diffraction, features 815, 825 are also distorted relative to apertures 715, 725 of mask 700 (FIG. 7). Features 815, 825 are expanded in the vicinity of separations 875, 880. As a consequence of this expansion, the ratio of first dimension 830 to second dimension 835 in pattern 800 (FIG. 8) is larger than the ratio of first dimension 730 to second dimension 735 in mask 700 (FIG. 7). Also, the ratio of first dimension 850 to second dimension 855 in pattern 800 (FIG. 8) is larger than the ratio of first dimension 730 to second dimension 735 in mask 700 (FIG. 7).

A number of embodiments of the invention have been described. Nevertheless, it will be understood that various modifications may be made without departing from the spirit and scope of the invention. For example, the description has generally assumed 1X printing when comparing the dimensions of masks and patterns printed with the masks. Other magnifications may be used with the dimensional comparisons adjusted to accommodate the different magnifications. The systems and techniques described herein may be used with light field photomasks and with other categories of PSMs, such as alternating PSMs. The systems and techniques may be used with either positive or negative photoresist, and features may be defined using apertures or attenuators as the patterning elements. The systems and techniques can be used with other feature geometries, including oblong features such as lines and spaces. Accordingly, other embodiments are within the scope of the following claims.

What is claimed is:

1. A method comprising:
identifying a pair of features to be printed using a corresponding pair of patterning elements, the pitch of the pair of features being sufficiently small that, upon printing, diffraction will make a separation between the features smaller than a separation between the corresponding pair of patterning elements; and
increasing a separation distance between the pair of patterning elements while maintaining the sufficiently small pitch.

2. The method of claim 1, wherein increasing the separation distance comprises distorting at least one of the patterning elements to have a decreased dimension in a direction parallel to the pitch in the vicinity of the sufficiently small pitch.

3. The method of claim 2, wherein increasing the separation distance comprises distorting the at least one patterning element to have an increased dimension in a direction perpendicular to the pitch.

4. The method of claim 1, wherein increasing the separation distance comprises distorting the patterning element to have substantially the same area as the undistorted patterning element.

5. The method of claim 1, wherein increasing the separation distance comprises designing the patterning element to directly and indirectly pattern a feature with a feature dimension in the direction parallel to the pitch substantially equal to a feature dimension in the direction perpendicular to the pitch.

6. The method of claim 1, wherein increasing the separation distance comprises bowing at least one of the patterning elements away from the other in the vicinity of the sufficiently small pitch.

7. The method of claim 1, wherein identifying the pair of features comprises identifying the corresponding patterning elements used to print the pair of features.

8. The method of claim 7, wherein identifying the pair of features comprises identifying a contact pair to be printed on the substrate to form part of an SRAN semiconductor device.

9. The method of claim 1, wherein identifying the pair of features comprises analyzing a machine readable description of one or more of the pair of features and the corresponding patterning elements used to print the pair of features.

10. The method of claim 1, wherein identifying the pair of features comprises identifying the pair of features on a photolithography mask.

11. A method comprising:
   identifying a pair of features to be printed using a corresponding pair of patterning elements, the pitch of the pair of features being sufficiently small that, upon printing, diffraction will make a separation between the features smaller than a separation between the corresponding pair of patterning elements; and
   increasing a dimension of at least one of the pair of patterning elements in a direction perpendicular to the sufficiently small pitch.

12. The method of claim 11, wherein increasing the dimension of at least one of the pair of patterning elements comprises designing the patterning element to print a corresponding feature with a feature dimension in the direction parallel to the pitch substantially equal to a feature dimension in the direction perpendicular to the pitch.

13. The method of claim 11, wherein identifying the pair of features comprises identifying a contact pair to be printed on the substrate.

14. The method of claim 13, wherein identifying the contact pair comprises analyzing a machine readable description of one or more of the contact pair and the patterning element to print the contact pair.

15. The method of claim 11, wherein identifying the pair of features comprises identifying the pair of features on a photolithography mask.

16. An article comprising a machine-readable medium storing instructions operable to cause one or more machines to perform operations comprising:
   identifying a pair of features to be printed using a corresponding pair of patterning elements, the pitch of the pair of features being sufficiently small that, upon printing, diffraction will make a separation between the features smaller than a separation between the corresponding pair of patterning elements; and
   increasing a separation distance between the pair of patterning elements while maintaining the sufficiently small pitch.

17. The article of claim 16, wherein the operations further comprise distorting at least one of the patterning elements to have a decreased dimension in a direction parallel to the pitch in the vicinity of the sufficiently small pitch.

18. The article of claim 17, wherein the operations further comprise distorting the at least one patterning element to have an increased dimension in a direction perpendicular to the pitch.

19. The article of claim 16, wherein the operations further comprise distorting the patterning element to have substantially the same area as the undistorted patterning element.

20. The article of claim 16, wherein the operations further comprise designing the patterning element to directly and indirectly pattern a feature with a feature dimension in the direction parallel to the pitch substantially equal to a feature dimension in the direction perpendicular to the pitch.

21. The article of claim 16, wherein the operations further comprise analyzing a machine readable description of the desired corresponding contact pair.

22. The article of claim 16, wherein identifying the pair of features comprises identifying the pair of features on a photolithography mask.

23. An apparatus comprising:
   a mask operative to image features using electromagnetic radiation having a wavelength, the mask including
   an adjacent pair of patterning elements having one or more distorted dimensions to accommodate for diffraction effects due to a size of the patterning elements and a spacing between the patterning elements approaching a diffraction limit of said radiation, wherein the dimensions of the patterning elements are distorted relative to dimensions of the imaged features.

24. The apparatus of claim 23, wherein the adjacent pair of patterning elements have a pitch, and
   wherein said distorted dimensions comprise an elongated dimension perpendicular to the pitch.

25. The apparatus of claim 23, wherein the adjacent pair of patterning elements have a pitch, and
   wherein said distorted dimensions comprise a shortened dimension parallel to the pitch.

26. The apparatus of claim 23, wherein the adjacent pair of patterning elements have a pitch, and
   wherein said distorted dimensions comprise a bowed portion in at least one of the patterning elements.

27. The apparatus of claim 23, wherein the dimensions are also distorted relative to other patterning elements in the mask operative to image corresponding features, but which do not approach the diffraction limit of the radiation.

28. The apparatus of claim 23, wherein the adjacent pair of patterning elements are operative to image a SRAM structure.

29. The apparatus of claim 28, wherein the SRAM structure comprises a lone pair.

* * * * *